United States Patent [19]

Bobeck

[11] 4,181,979
[45] Jan. 1, 1980

[54] MAGNETIC BUBBLE MEMORY WITH SINGLE-LEVEL BUBBLE FUNCTIONAL ELEMENTS

[75] Inventor: Andrew H. Bobeck, Chatham, N.J.

[73] Assignee: Bell Telephone Laboratories, Incorporated, Murray Hill, N.J.

[21] Appl. No.: 914,960

[22] Filed: Jun. 12, 1978

[51] Int. Cl.² .................................... G11C 19/08
[52] U.S. Cl. ................................ 365/20; 365/14; 365/36; 365/37
[58] Field of Search ............... 365/19, 20, 21, 37

[56] References Cited

U.S. PATENT DOCUMENTS

| | | | |
|---|---|---|---|
| 3,678,479 | 7/1972 | Owens | 365/20 |
| 3,967,002 | 6/1976 | Almasi et al. | 365/37 |

OTHER PUBLICATIONS

AIP Conference Proceedings, Magnetism & Magnetic Materials No. 24, 1974, pp. 550–551.

Primary Examiner—James W. Moffitt
Attorney, Agent, or Firm—Herbert M. Shapiro

[57] ABSTRACT

Magnetic bubble functional elements are implemented by aperture patterns in a single layer of electrically-conducting material. The operations of the elements are compatible with single-level conductor driven bubble memories described in A. H. Bobeck patent applications, Ser. Nos. 857,921 now U.S. Pat. No. 4,143,419 issued Mar. 6, 1979 and 856,925, filed Dec. 6, 1977, and in A. H. Bobeck-F. J. Ciak patent application, Ser. No. 899,578, filed Apr. 24, 1978 now abandoned.

4 Claims, 5 Drawing Figures

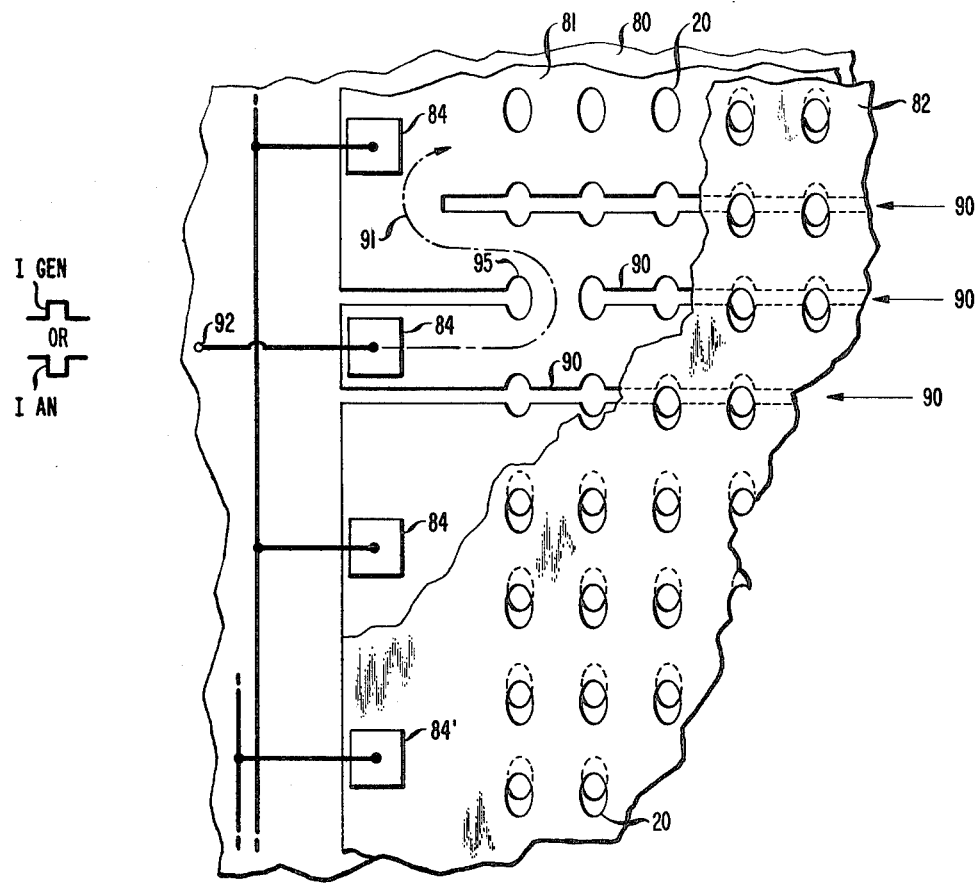

ns, the implementation of a current-controlled bubble generator requires additional processing steps over and above those required to realize the propagation arrangement. On the other hand, generators utilizing just permalloy are slow and dissipate too much power to allow high speed operation.

MAGNETIC BUBBLE MEMORY WITH SINGLE-LEVEL BUBBLE FUNCTIONAL ELEMENTS

BACKGROUND OF THE INVENTION

Magnetic bubble memories are well known in the art. Common to such memories is a current-controlled bubble generator which provides a magnetic bubble at an input position in the memory in response to an input signal. For a "field-access" type bubble memory employing a pattern of permalloy elements for moving bubbles along propagation paths, the implementation of a current-controlled bubble generator requires additional processing steps over and above those required to realize the propagation arrangement. On the other hand, generators utilizing just permalloy are slow and dissipate too much power to allow high speed operation.

Even in "conductor-access" bubble memories current-controlled bubble generators may require additional processing steps. This is particularly clear in the case of one-level conductor drive "E field-access" bubble memories of the type described in copending applications, Ser. Nos. 857,921 (U.S. Pat. No. 4,143,419) and 857,925, filed Dec. 6, 1977, for A. H. Bobeck and in copending application, Ser. No. 899,578, filed Apr. 24, 1978 now abandoned for A. H. Bobeck and F. J. Ciak. In these cases, the propagation implementation includes a single layer of electrically-conducting material which includes apertures for defining propagation paths. The problem to which the present invention is directed is the realization of a current-controlled bubble generator utilizing a single electrically-conducting layer which is also used for generating propagate fields without necessitating additional levels of processing—i.e., another layer of electrically-conducting material.

BRIEF DESCRIPTION OF ILLUSTRATIVE EMBODIMENTS

The solution to this problem is to form a single layer of electrically-conducting material into portions to permit generally uniform current flow for moving bubbles when all the portions of the layers have currents impressed in parallel therein and to include apertures in one of the portions to provide a curved current path when a current is impressed in that portion alone. This peculiarly-apertured, electrically-conducting level is cooperative with a current supply which impresses currents in the one or all of the portions selectively.

In one embodiment, a generator compatible with the use of auxiliary ion-implanted regions for causing bubble movement parallel to the current flow is shown. In another, a generator compatible with bubble movement perpendicular to the current flow is shown. In a third embodiment, current flow is impressed in two electrically-conducting layers alternately for achieving bubble movement. The bubble generator still is defined in only one of the layers in order to generate bubbles in a manner consistent with bubble propagation.

It is clear that apparatus encompassed by this invention comprises a layer of material in which magnetic bubbles can be moved, and means for moving bubbles in the layer along a propagation path where the means comprises a second layer of electrically-conducting material which includes a pattern of apertures for defining that path. The apparatus is characterized in that the second layer includes slots for defining in that layer at least first and second portions in which currents can be impressed electrically in parallel or only in the first portion selectively. The slots are adapted for defining a discrete current path for currents impressed only in the first portion. The apparatus is cooperative with means for impressing currents in the first or in the first and second portions selectively. The slots do not have to penetrate the electrically-conducting layer.

BRIEF DESCRIPTION OF THE DRAWING

FIGS. 2, 3, and 4 are enlarged top views of alternative portions of a memory of the type represented in FIG. 1; and, FIG. 5 is a pulse diagram of the operation of memories of the type shown in FIG. 1.

DETAILED DESCRIPTION OF ILLUSTRATIVE EMBODIMENTS

Figure 1:
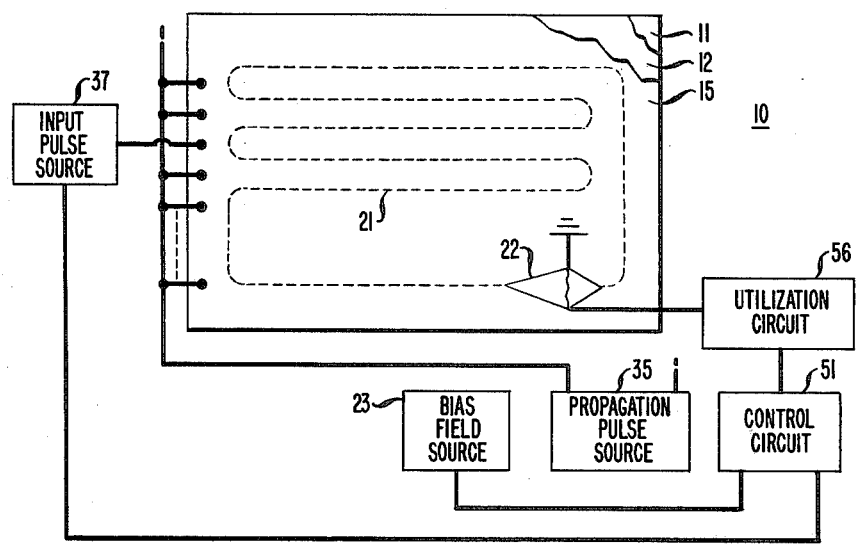
FIG. 1 is a schematic representation of a magnetic bubble memory in accordance with this invention.

FIG. 1 shows a magnetic bubble memory 10 including, typically, a nonmagnetic substrate 11 on which an epitaxial bubble layer 12 is grown. It is common to employ nonmagnetic garnet crystals for the substrate and to employ a rare earth iron garnet for the epitaxial layer designed to achieve a growth-induced anisotropy sufficient to support bubbles. The memory is characterized by a layer 15 of electrically-conducting material such as aluminum (96 percent)-copper (4 percent) with a thickness of about 4500 angstrom units.

Figure 2:
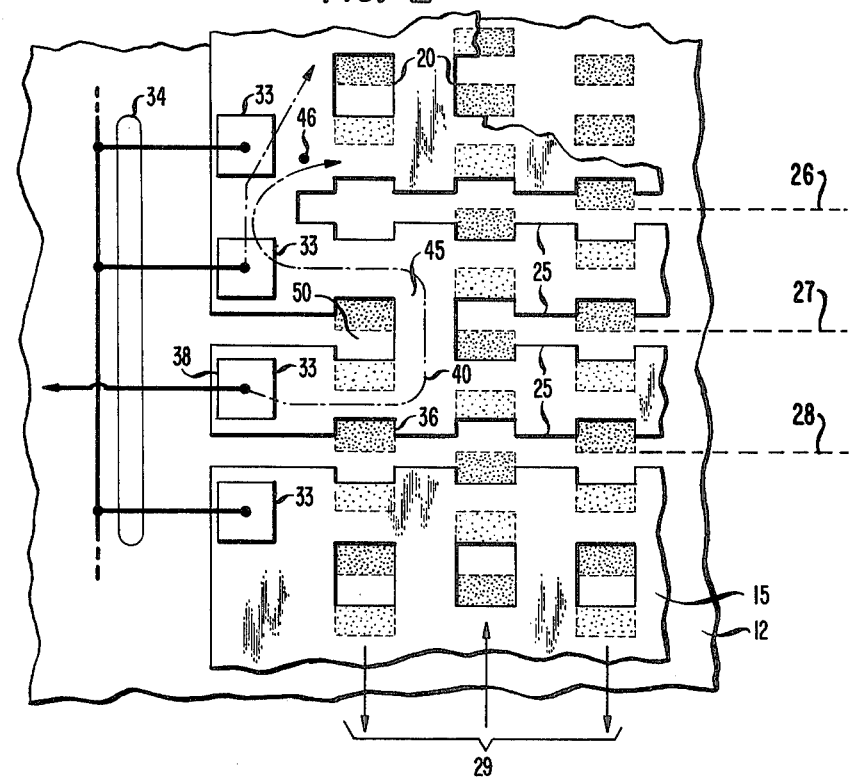
Figure 3:
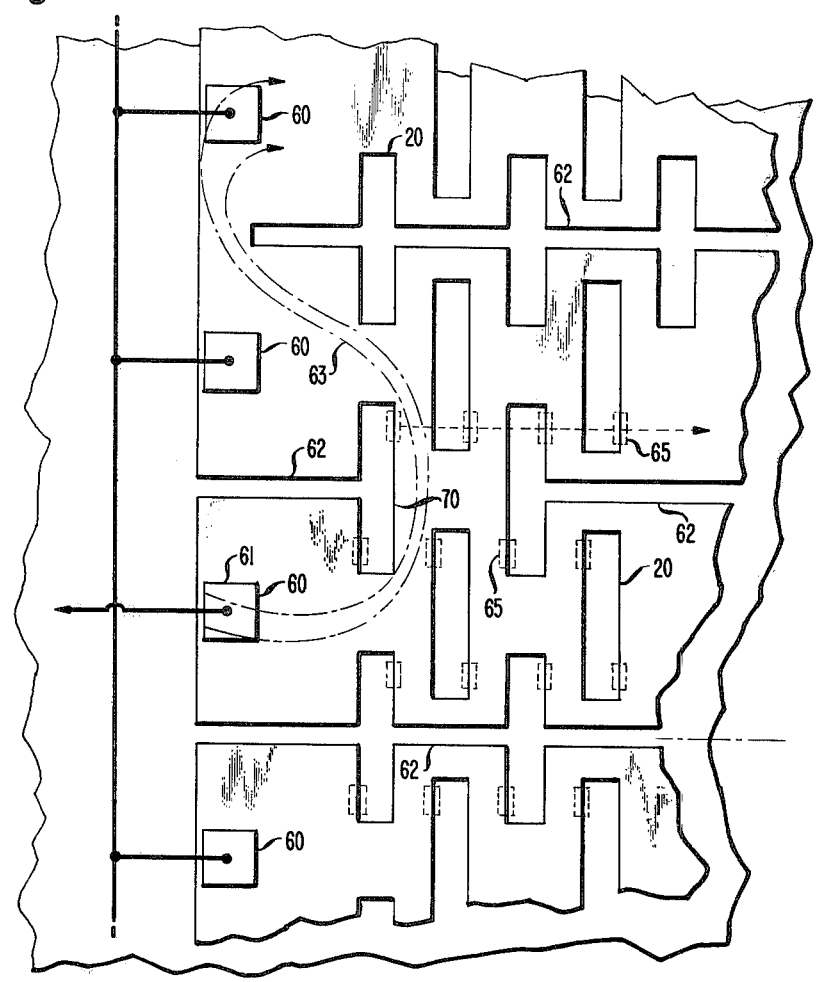

The conducting layer includes a pattern of apertures (20), shown in each of FIGS. 2, 3, and 4, which defines paths of bubble propagation shown as broken lines 21 in FIG. 1. The pattern of apertures also defines an expander-detector identified at 22 in FIG. 1. A suitable expander-detector is disclosed in copending application Ser. No. 857,919 filed Dec. 6, 1977 for A. H. Bobeck now U.S. Pat. No. 4,142,247 issued Feb. 27, 1979. Path 21, as indicated, is in the form of a closed loop including the usual expander-detector adapted further in a well understood manner to reduce the lateral dimension of a domain, after detection, to a nominal bubble size for propagation. The nominal bubble size is determined by a bias field antiparallel to the magnetization of a bubble and supplied by a familiar source represented by block 23 in FIG. 1.

Also included in the electrically-conducting layer is a pattern of slots 25 which connects selected ones of apertures 20. It is to be understood that neither apertures 20 nor slots 25 need penetrate layer 15 entirely. They may be formed by a reduction in thickness of layer 15. All that is necessary is that the geometry be such as to reduce the electric current intensity locally. Slots 25 are operative to direct the flow of current in layer 15. It is convenient to designate three adjacent rows of apertures in FIG. 2 as 26, 27, and 28 in explaining the operation of the slots. In the embodiment of FIG. 2, bubbles propagate along paths transverse to these rows in response to a current flow parallel to the rows as disclosed in the above copending application Ser. No. 857,921. The axis of bubble movement in the embodiment of FIG. 2 is indicated by the arrows 29.

Figure 5:
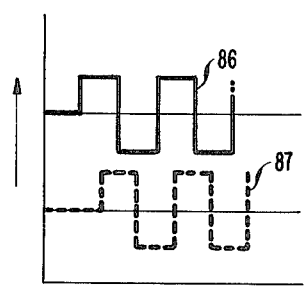

Current flow is impressed in layer 15 for effecting bubble propagation in response to bipolar current pulses of the type shown in top line of FIG. 5 to electrically-conducting lands 33 via conductors 34. The pulses are applied to conductors 34 by a propagation pulse source 35. Pulse source 35 may comprise a straightforward adaptation of known square wave drivers for use, for example, with field-access bubble memories.

Ion-implanted regions 36 are formed in layer 12 in alignment with edges of apertures 20 along the path of bubble movement. Each current pulse impressed during a propagation operation moves bubbles to the edges of apertures. When that pulse terminates, the bubbles move to next consecutive ion-implanted regions. The placement of apertures and ion-implanted regions in offset positions causes bubble movement in response to a sequence of bipolar pulses as is taught in the above-mentioned A. H. Bobeck patent application, Ser. No. 857,921.

The currents impressed during a propagate operation essentially are unaffected by the presence of slots 25. Rather than being affected by those slots, the currents flow substantially uniformly overall from left to right as viewed in FIG. 2, the flow being modified only locally by apertures 20 for producing the changing pattern of localized field gradients for effecting bubble movement.

During a write operation, on the other hand, current flow in layer 15 is affected by slots 25. During this operation, an input pulse source represented by block 37 in FIG. 1 applies a pulse (only) to land 38 in FIG. 2 if it is desired to enter a bubble (binary one) during the input cycle of operation. The slots (25) are designed to route substantially all of the current flow along a path indicated by broken curved arrow 40.

The current flows along the path of arrow 40 because that path is the low resistance path for the current. The slots continue from left to right, as viewed in FIG. 2, along rows 26, 27, and 28 to define at least partial separated portions of layer 15 of defined width. The length to width ratio of each of the portions determines the number of squares of resistance a current "sees". Opening 45 in slot 25 along row 27 allows the current flow to move along the path of arrow 40 to a position 46 where slots 25 no longer confine the current flow. At that position, the current "sees" essentially only one square of resistance. So long as the partially separated portions defined by the slots along rows 26, 27, and 28 have a significantly greater number of squares of resistance than does path 40, current flows mainly along path 40.

Current flow along path 40, of course, causes a relatively high magnetic field to be generated at 50. This field is designed to exceed the nucleation threshold characteristic of layer 12 and results in the presence of a bubble at position 50 when source 37 applies an input pulse to land 38 in the absence of pulses from source 35. Control circuit 51 of FIG. 1 controls the activation and synchronization of sources 35 and 37 and may be adapted as is discussed further hereinafter, to activate both sources together or source 37 alone.

Bubbles introduced in this manner at position 50 (the input position) advance along path 21 of FIG. 1 to the expander-detector arrangement 22. Conveniently, a thin film magnetoresistance detector of permalloy is disposed beneath layer 15 at position 55 in FIG. 1. The detector is responsive to an interrogate pulse from circuit 51 to apply a signal to utilization circuit 56 if a bubble is at the detector when the interrogate pulse occurs.

FIG. 3 shows an embodiment of this invention in which bubble movement is along an axis parallel to current flow. Once again current is provided at all lands 60 for a propagate operation and selectively at land 61 for a write operation. Current flows uniformly overall, from left to right as viewed, or is contoured into a path represented by broken, curved arrows 63 by slots 62. Once again the slots are disposed and are of lengths to define paths having numbers of squares of resistance so that current follows arrows 63 when land 61 is pulsed and current flow is uniform overall when all lands 60 are pulsed. Ion-implanted regions 65 define bubble propagation paths during a propagate operation as disclosed in the above-mentioned application Ser. No. 857,925 of the present inventor.

As was the case with the embodiment of FIG. 2, a current in the path of arrows 63 produces a relatively high magnetic field at 70 in FIG. 3. That field is designed to exceed the nucleation threshold of the bubble layer thus permitting selective generation of bubbles there.

It is to be emphasized that the slots which define the contoured current path for currents impressed during a write operation in either of the embodiments of FIGS. 2 and 3 are transparent during propagate operations. This is clear from inspection of the Figures. It is the case also with embodiments of the type shown in FIG. 4.

FIG. 4 shows a bubble layer 80 with first and second electrically-conducting layers 81 and 82 separated by an electrically-insulating layer not shown. Each of layers 81 and 82 includes a set of apertures 20. The apertures of the two layers are offset with respect to one another to provide changing patterns of field gradients when all of lands 84 or 84', electrically connected to layers 81 and 82, respectively, are pulsed by pulse forms 86 and 87, respectively, of FIG. 5. The operation of embodiments of this type is disclosed in the above-mentioned patent application of the present inventor filed on even date herewith. Importantly, slots 90 define a curved path represented by arrow 91 when only land 92 is pulsed selectively in the manner of the embodiments of FIG. 2 or 3. A bubble is generated at position 95. Note that the slots are included in only one conducting layer of the embodiment of FIG. 4.

Bubble memories employing uniform electrically-conducting layers of the type described herein typically employ propagate current pulses having densities of 2 milliamperes/micron and durations of 0.5 microseconds. The pulse applied for writing typically is 150 milliamperes. Such a pulse is operative to generate a write field in excess of the anisotropy field $H_k$ of the bubble layer which typically is 1500 oersteds.

In all the embodiments shown herein, it is convenient to adapt source 37 to apply pulses to, say, land 38 of the embodiment of FIG. 2, for example, simultaneously with the propagate pulses applied by source 35. This is done under the control of control circuit 50 and allows propagate pulses at all lands, during a propagate operation and at the input land during a write operation. Alternatively, source 35 may be connected directly to, say, land 38 of FIG. 2 via connection 34, control circuit 51 being adapted to apply pulses from source 35 or 37 to land 38 alternatively. In practice source 35 is adapted to work in conjunction with source 37 to provide the requisite propagation pulses.

The introduction of slots between selected apertures in the conducting layers herein to define contoured current paths provides a technique for producing other functional implementations to bubble memories of the type described herein. For example, a bubble annihilator can be defined by the introduction of slots. For example, a bubble moved to position 95 in FIG. 4 is annihilated by an annihilate pulse $I_{an}$, of a polarity opposite to the generate pulse $I_{gen}$, applied to land 92.

What has been described is considered to be merely illustrative of the principles of this invention. Accordingly, various embodiments can be devised by those skilled in the art within the spirit and scope of the invention as encompassed by the following claims. For example, the embodiment of FIG. 4 includes two like electrically-conducting layers. In practice, like slots may be included in both layers for implementing or aiding the operation described.

I claim:

1. A magnetic bubble memory including a first layer of material in which magnetic bubbles can be moved, means for moving bubbles in said layer along a propagation path, said means comprising a second layer of electrically-conducting material including therein a pattern of apertures for defining said path, said pattern including slots for defining in said second layer at least first and second portions in which currents can be impressed alternatively in said first portion alone or in said first and second portions in parallel, said slots being adapted for defining a contoured current path in response to a current impressed in said first portion alone and means for impressing currents in said first or in said first and second portions selectively.

2. A magnetic bubble memory in accordance with claim 1 wherein said memory also comprises means for defining rest positions offset from edges of said apertures along a bubble path.

3. A magnetic bubble memory in accordance with claim 2 wherein said memory comprises a third layer of electrically-conducting material including a pattern of apertures and disposed with respect to said apertures in said second layer to move bubbles along a path in said first layer when substantially uniform overall current pulses are impressed alternately in said second and third layers.

4. A magnetic bubble memory (10) including a first layer (12) in which magnetic bubbles can be moved, and means (15, 20, 35) for moving bubbles in the layer along a propagation path (21), the means comprising a second layer of electrically-conducting material 15 including a pattern of apertures (20) for defining the path (21), characterized in that the second layer includes slots for separating the second layer into at least first and second portions in which currents can be impressed electrically in parallel or selectively, wherein the slots are adapted for defining a discrete current path (46) for currents impressed in said first portion alone (37 and 38), and means (35, 33) for impressing currents in the first or in the first and second portions selectively.

* * * * *